(12) United States Patent
Ramkumar et al.

(10) Patent No.: US 6,436,799 B1
(45) Date of Patent: Aug. 20, 2002

(54) PROCESS FOR ANNEALING SEMICONDUCTORS AND/OR INTEGRATED CIRCUITS

(75) Inventors: Krishnaswamy Ramkumar, San Jose; Manuj Rathor, Santa Clara, both of CA (US)

(73) Assignee: Cypress Semiconductor, Corporation, San Jose, CA (US)

( * ) Notice: Subject to any disclaimer, the term of this patent is extended or adjusted under 35 U.S.C. 154(b) by 0 days.

(21) Appl. No.: 09/670,089

(22) Filed: Sep. 26, 2000

(51) Int. Cl.$^7$ .............................................. H01L 21/425
(52) U.S. Cl. ........................ 438/530; 438/475; 438/592
(58) Field of Search ................................ 438/530, 475, 438/308, 258, 592, 795

(56) References Cited

U.S. PATENT DOCUMENTS 5,972,765 A * 10/1999 Clark et al. .................. 438/308
6,218,245 B1 * 4/2001 Xiang et al. ................. 438/258

OTHER PUBLICATIONS

*Encyclopedia of Chemical Technology*, Kirk–Othmer, vol. 14, 1995, pp. 677–709.
Peter Van Zant, *Microchip Fabrication*, 3rd Edition, McGraw–Hill, 1997, pp. 491–527.
I. J. R. Baurnvol et al, On The Behavior Of Deuterium In Ultrathin $SiO_2$ Films Upon Thermal Annealing, American Institute of Physics, Appl. Phys. Lett. 72 (4), Jan. 1998, pp. 450–452.
Karl Hess et al., Giant Isotope Effect In Hot Electron Degradation Of Metal Oxide Silicon Devices, IEEE Transactions On Electron Devices, vol. 45. No. 2, Feb. 1998, pp. 406–416.
Jinju Lee et al., Secondary Ion Mass Spectroscopy Characterization Of The Deuterium Sintering Process For Enhanced–Lifetime Complementary Metal–Oxide–Semiconductor Transistors, American Vacuum Society, J. Vac. Sci. Technol. A 16(3), May/Jun. 1998, pp. 1762–1766.

I. C. Kizilyalli, et al., Improvement of Hot Carrier Reliability With Deuterium Anneals for Manufacturing Multilevel Metal/Dielectric MOS Systems, IEEE Electron Device Letters, vol. 19. No. 11, Nov. 1998, pp. 444–446.
W. F. Clark et al., Process Stability of Deuterium–Annealed MOSFET'S, IEEE Electron Device Letters, vol. 20 No. 1, Jan. 1999, pp. 48–50.
Thomas G. Ference et al., The Combined Effects of Deuterium Anneals and Deuterated Barrier–Nitride Processing on Hot–Electron Degradation in MOSFET'S, IEEE Transactions On Electron Devices, vol. 46. No. 4, Apr. 1999, pp. 747–753.
Jinju Lee et al., The Effect of Deuterium Passivation At Different Steps of CMOS Processing on Lifetime Improvements of CMOS Transistors, IEEE Transaction of Electron Devices, Vo. 46 No. 8, Aug. 1999, pp. 1812–1813.
W. F. Clark et al., Pimproved Hot–Electron Reliability In High–Performance. Multilevel–Metal CMOS Using Deuterated Barrier–Nitride Processing, IEEE Electron Device Letters, vol. 20 No. 10, Oct. 1999, pp. 501–503.
Jinju Lee et al., Application Of High Pressure Deuterium Annealing For Improving The Hot Carrier Reliability of CMOS Transistors, IEEE Electron Device Letters, vol., 21, No. 5, May 2000, pp. 221–223.
Robert F. Pierret, *Semiconductor Device Fundamentals*, Addison–Wesley, 1996.
Wolf, *Silicon Processing for the VLSI Era*, Vols. 1–3, Lattice Press, 1986, 1990, 1995 (vols. 1–3, respectively).

* cited by examiner

*Primary Examiner*—David Nelms
*Assistant Examiner*—Reneé R. Berry
(74) *Attorney, Agent, or Firm*—Brinks Hofer Gilson & Lione

(57) ABSTRACT

A method of making a semiconductor structure, includes annealing a structure in a deuterium-containing atmosphere. The structure includes (i) a substrate, (ii) a gate dielectric on the substrate, (iii) a gate on the gate dielectric, (iv) an etch-stop layer on the gate, and (v) an interlayer dielectric on the etch-stop layer.

13 Claims, 1 Drawing Sheet

PROCESS FOR ANNEALING SEMICONDUCTORS AND/OR INTEGRATED CIRCUITS

BACKGROUND

The present invention relates to semiconductor structures, semiconductor devices and methods of making the same.

Dangling bonds at the silicon/silicon oxide interface in semiconductor devices are believed to be the cause of observed non-ideal capacitance-voltage characteristics and reduced channel conductance. Low temperature post-metallization annealing in a hydrogen-containing atmosphere is typically used in the semiconductor device fabrication process, to passivate these dangling bonds. During operation, however, transistor performance can degrade, and this degradation has been correlated to the removal of hydrogen from the silicon/silicon oxide interface, due to collisions between heated carriers and the interface. This degradation in hot carrier lifetime (also referred to as HCl lifetime) is exacerbated by the ever ongoing miniaturization of semiconductor devices, and has become a significant limitation in the further shrinkage of semiconductor devices.

A widely used method for minimizing the degradation of HCl lifetime has been to reduce the peak of the electric field in the transistor by appropriate selection of spacer dimensions, and the implantation of ions to form lightly doped regions between the channel and the corresponding source/drain regions of the transistor. Continued miniaturization is severely limiting the usefulness of these techniques.

Another method is to replace hydrogen with deuterium during annealing, taking advantage of the increased strength of the deuterium-silicon bond as compared with the hydrogen-silicon bond. It has been discovered, however, that deuterium is unable to penetrate through silicon nitride layers, present in many semiconductor devices as etch-stop layers and gate spacers. If the deuterium annealing is carried out prior to the formation of the silicon nitride layers, the high-temperatures necessary to form the silicon nitride layers, as well as the boron-phosphorous spin glass layers conventionally used as interlayer dielectrics (750° C. or more), may cause the deuterium to diffuse out. Attempts to overcome these problems have relied on expensive techniques, such as using deuterated silane and ammonia to form the silicon nitride layers, or dangerous techniques, such as annealing in a 100% deuterium atmosphere.

BRIEF SUMMARY

In a first aspect, the present invention is a method of making a semiconductor structure, including annealing a structure in a deuterium-containing atmosphere. The structure contains a substrate, a gate dielectric on the substrate, a gate on the gate dielectric, an etch-stop layer, on the gate, and an interlayer dielectric on the etch-stop layer.

In a second aspect, the present invention is a semiconductor device, containing a substrate, a gate dielectric on the substrate, a gate on the gate dielectric, and a silicon nitride layer, on the gate. The silicon nitride layer is not enriched with deuterium, and an interface between the gate dielectric and the substrate is deuterium enriched.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention makes use of the discovery that deuterium will diffuse through the substrate during annealing sufficiently to reach the substrate/gate dielectric interface from a relatively small exposed portion of the substrate near the interface. Since a small area of the substrate is exposed after etching contact holes in the etch-stop layer, which takes place after formation of the etch-stop layer and the interlayer dielectric, effective annealing in a deuterium-containing atmosphere can be carried out without subsequently exposing the substrate/gate dielectric interface to temperatures above 750° C.

Figure 1:
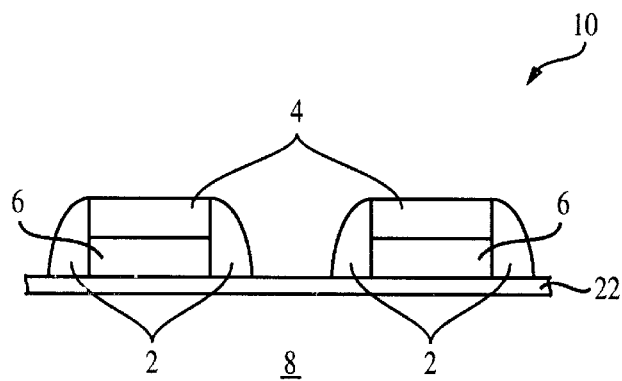
FIG. 1 illustrates a semiconductor structure.

FIG. 1 illustrates a semiconductor structure 10, including a substrate 1, a gate dielectric layer 22 on the substrate, gates 6 on the gate dielectric layer, caps 4 on the gates, and spacers 2 on the gate dielectric layer and on both sides of the gates and caps. The gate dielectric, the caps, and the spacers may be made from any dielectric material. Preferably, the gate dielectric comprises an oxide, more preferably silicon dioxide. Preferably, the caps and the spacers comprise a nitride, more preferably silicon nitride. The gates may be made from any conductive material, preferably silicon, most preferably doped polycrystalline silicon. The substrate may be made from any semiconductor, preferably single crystal silicon.

Prior to annealing in a deuterium-containing atmosphere, an etch-stop layer 12 is formed on the structure shown in FIG. 1, followed by forming an interlayer dielectric 16. The etch-stop layer is generally formed of a material that is different from the interlayer dielectric. For example, the interlayer dielectric may comprise silicon nitride, and the etch-stop layer may comprise silicon dioxide; or preferably, the interlayer dielectric may comprise borophosphosilicate glass, and the etch-stop layer may comprise silicon nitride or an undoped silicate glass. These layers are typically formed at a temperature of at least 750° C., and therefore they are preferably formed prior to annealing the structure in a deuterium-containing atmosphere.

Figure 2:
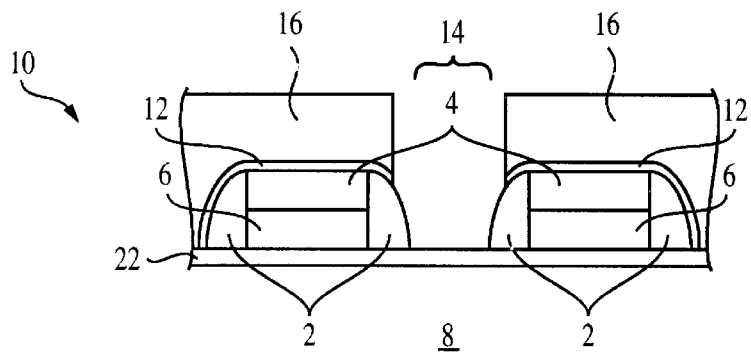
FIG. 2 illustrates a semiconductor structure ready for annealing.

Next, a region of the substrate is exposed by first etching a contact hole in the interlayer dielectric, and then further extending the contact hole by etching the exposed portions of the etch-stop layer. As shown in FIG. 2, the structure produced includes a contact hole 14, which passes through the interlayer dielectric 16 and the etch-stop layer 12. The etch stop layer may be etched using the interlayer dielectric as a hard mask. As shown in FIG. 2, the gate dielectric layer 22 may remain at the bottom of the contact hole, or alternatively, the portion of the gate dielectric remaining at the bottom of the contact hole may also be removed by etching. The gate dielectric layer is thin enough that it does not interfere with the annealing process.

The structure shown in FIG. 2 contains a portion of the substrate at the bottom of the contact hole which is exposed. The phrase "a portion of the substrate is exposed through the contact hole" means that there is nothing on that portion of the substrate that would prevent diffusion of deuterium into the substrate. For example, the gate dielectric layer may be present on the exposed portion of the substrate, but a nitride etch-stop layer may not be present on the exposed portion of the substrate.

The structure shown in FIG. 2 may be annealed in a deuterium-containing atmosphere. A deuterium-containing atmosphere is a gas that contains deuterium in a higher concentration than would naturally be present based on the amount of hydrogen in the gas. This atmosphere preferably contains 1–99% deuterium, more preferably 2–50% deuterium, even more preferably 5–30% deuterium, and most preferably 10–20% deuterium, by volume. The remaining portion of the atmosphere is not limited, but preferably contains an inert gas, such as nitrogen, helium, neon, argon, krypton, xenon and mixtures thereof. Other possible gases include hydrogen (a small amount of which is commonly present in deuterium), and hydrocarbons or deuterated hydrocarbons such as methane and ethane. The annealing temperature is preferably at least 450° C. The maximum temperature for annealing is limited by the tolerance of the structure being annealed to heating without being damaged. Preferably, the annealing temperature is 450–850° C., more preferably 475–600° C., and most preferably 500–550° C. The atmosphere pressure is preferably 0.1 Torr to 10 atmospheres, more preferably 100 Torr to 2 atmospheres, most preferably about 1 atmosphere. The annealing time is chosen to allow diffusion of the deuterium into the substrate/gate dielectric interface, and will decrease as the temperature increases, the concentration of deuterium in the atmosphere increases, and/or the pressure increases. Preferably, the annealing time is for at least 1 minute, more preferably 10 minutes to 72 hours, even more preferably 1–10 hours, and most preferably 3–5 hours.

Figure 3:
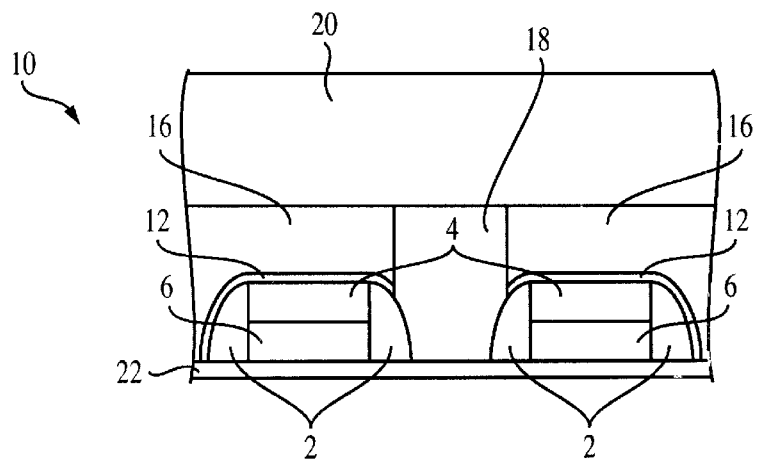
FIG. 3 illustrates a semiconductor structure after annealing and subsequent processing.

After the annealing process, the structure may be formed into a device. For example, the contact hole may be filled with a liner/barrier layer (such as Ti, TiN, TiW, TaN or a combination thereof) and/or a conductor, such as tungsten, copper or aluminum, to form a contact 18, and then metallization 20 containing a conductor such as titanium, TiN, copper or aluminum, may be formed on the interlayer dielectric, to electrically connect a portion of the substrate with other structures (not shown), as illustrated in FIG. 3. Any subsequent processing preferably does not include heating the structure over a temperature of at most 800° C., more preferably at most 750° C., even more preferably at most 600° C., even more preferably at most 500° C., and most preferably at most 450° C.

Annealing the structure in a deuterium-containing atmosphere will result in an increase in the HCl lifetime, as compared with an otherwise identical structure annealed in an atmosphere that contains hydrogen instead of deuterium for example, an increase in HCl lifetime of at least 10%, more preferably at least 50%, most preferably at least 200%, such as 300–600%, may be obtained as a result of the present method.

The HCl lifetime is measured as follows:

(1) Characterize the substrate current for the transistors by measuring $I_{bb}$ while sweeping the gate voltage from 0 to $V_{cc(nom)}$ and stepping the drain voltage over four values starting at $V_{cc(nom)}$ and with a step value of 10% $V_{cc(nom)}$. For each value of $V_{ds}$ measured, record the value of gate voltage that yields the maximum substrate current and record the substrate current at that setting.

(2) Stress the transistors at 3 different values of $V_{ds}$. The values of $V_{ds}$ should be chosen so as to cause a significant shift in $I_{dlin}$ (>30%) in a measurement time of less than 24 hours. The voltage should not be set so high as to result in distorted I-V characteristics. The gate voltage should be set at the value yielding maximum $I_{bb}$ for a given $V_{ds}$. Stress until $I_{dlin}$ shifts by 30%, unless this occurs in less than 1000 sec., in which case the stopping criteria is a 40% shift in $I_{dlin}$, or a lower voltage should be used.

(3) The data is extrapolated to determine HCl lifetime ($\tau_{lin}$), the time for $I_{dlin}$ to shift by 40%.

The present invention does not require the use of deuterium enriched silicon nitride layers, which are produced from ammonia and silane that contains more deuterium that would be expected to be present naturally, to retain the benefits of annealing in a deuterium-containing atmosphere. The phrase "deuterium enriched" means that the proportion of deuterium to hydrogen measured is at least 25%, preferably at least 50%.

The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, vols. 1–3, Lattice Press, 1986, 1990, 1995 (vols 1–3, respectively), and Microchip Fabrication 3rd. edition, Peter Van Zant, McGraw-Hill, 1997.

The metallization and the contact may include any conductive material. Examples of conductive materials include metals, alloys and/or highly doped semiconductor materials. A conductive material may include, for example, Al, Cu, Au, Ag, W, Ti, Zr, Mo, Pt, Ir, Pd, Mg, Ta, Cr, Ni, doped Si, Ge, alloys thereof, and compounds thereof.

The interlayer dielectric layer, the gate dielectric layer and the etch-stop layer may be made from any dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon nitride, silicon oxide, P-doped silicon oxide (P-glass), for example $SiO_2$, $Si_3N_4$, $Al_2O_3$, $SiO_xN_y$, etc. The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt % of phosphorous and 0–8 wt % of boron).

The structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

Obviously, numerous modifications and variations of the present invention are possible in light of the above teachings. It is therefore to be understood that within the scope of the appended claims, the invention may be practiced otherwise than as specifically described herein.

What is claimed is:

1. A method of making a semiconductor structure, comprising: annealing a structure in a deuterium-containing atmosphere; wherein said structure comprises (i) a substrate, (ii) a gate dielectric on said substrate, (iii) a gate, on said gate dielectric, (iv) an etch-stop layer, on said gate, (v) an interlayer dielectric, on said etch-stop layer, and (vi) a contact hole, through said interlayer dielectric and said etch-stop layer, and a portion of the substrate is exposed through said contact hole.

2. The method of claim 1, further comprising, after said annealing, forming metallization on said interlayer dielectric.

3. The method of claim 1, wherein said annealing is at a temperature of 450 to 850° C.

4. The method of claim 1, wherein said annealing is at a temperature of 475 to 600° C.

5. The method of claim 1, wherein said annealing is at a pressure of 0.1 Torr to 10 atmospheres.

6. The method of claim 1, wherein said annealing is at a pressure of 100 Torr to 2 atmospheres.

7. The method of claim 1, wherein said annealing is carried out for 1 to 10 hours.

8. The method of claim 1, wherein said deuterium-containing atmosphere comprises 2–50% by volume of deuterium.

9. The method of claim 1, wherein said deuterium-containing atmosphere comprises 5–30% by volume of deuterium.

10. The method of claim 1, wherein said structure is not exposed to temperatures greater than 750° C. after said annealing.

11. A semiconductor structure produced by the method of claim 1.

12. A method of making a semiconductor device, comprising:

making a semiconductor structure by the method of claim 1; and forming a semiconductor device from said semiconductor structure.

13. A method of making electronic device, comprising:

making a semiconductor structure by the method of claim 12; and forming an electronic device comprising said semiconductor device.

* * * * *

UNITED STATES PATENT AND TRADEMARK OFFICE
CERTIFICATE OF CORRECTION

| | | |
|---|---|---|
| PATENT NO. | : 6,436,799 B1 | Page 1 of 1 |
| APPLICATION NO. | : 09/670089 | |
| DATED | : August 20, 2002 | |
| INVENTOR(S) | : Krishnaswamy Ramkumar et al. | |

It is certified that error appears in the above-identified patent and that said Letters Patent is hereby corrected as shown below:

In the claims:

Column 6, Claim 12 line 16, after "making", please insert --an--.

Column 6, Claim 13 line 17, please delete "structure" and insert --device--.

Signed and Sealed this

Thirtieth Day of January, 2007

JON W. DUDAS
*Director of the United States Patent and Trademark Office*